(12) United States Patent
Koh et al.

(10) Patent No.: US 6,686,656 B1
(45) Date of Patent: Feb. 3, 2004

(54) INTEGRATED MULTI-CHIP CHIP SCALE PACKAGE

(75) Inventors: Wei H. Koh, Irvine, CA (US); Fred Kong, Irvine, CA (US); Daniel Hsu, Fountain Valley, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 0 days.

(21) Appl. No.: 10/340,961

(22) Filed: Jan. 13, 2003

(51) Int. Cl.[7] .............................................. H01L 23/02
(52) U.S. Cl. ........................................ 257/686; 257/777
(58) Field of Search ................................. 257/685, 686, 257/723, 724, 777

(56) References Cited

U.S. PATENT DOCUMENTS 5,798,564 A  *  8/1998  Eng et al.
5,973,393 A  * 10/1999  Chia et al.
6,303,997 B1 * 10/2001  Lee
6,583,503 B2 *  6/2003  Alkram et al.

* cited by examiner

*Primary Examiner*—Sheila V. Clark
(74) *Attorney, Agent, or Firm*—Morland C. Fischer (57) ABSTRACT

A vertically integrated chip scale package (CSP) assembly comprising two or more single chip package subassemblies having an upper level CSP subassembly superimposed directly above a lower level CSP subassembly. The lowermost CSP subassembly in the vertical stack contains an array of solder balls for interconnection to a printed wiring board. The vertical electrical connection between the upper and lower level package subassemblies is accomplished by using wire bonding from perimeter wire bonding pads located on an upper level substrate extension to matching perimeter wire bonding pads located on a lower level substrate extension that is longer in length than the upper level substrate extension. The stacked package subassemblies are bonded together by using a thin adhesive material, and the perimeter wire bonds are encapsulated by an encapsulant for protection. The assembled vertical stack has the appearance of a single CSP but is shorter in height than two individual packages that are stacked together with solder ball interconnects located therebetween.

18 Claims, 7 Drawing Sheets

FIG. 10

INTEGRATED MULTI-CHIP CHIP SCALE PACKAGE

BACKGROUND OF THE INVENTION

1. Field of the Invention

The present invention relates generally to an integrated, space efficient multi-level semiconductor chip scale package and, more particularly, to a high capacity memory semiconductor package using a minimum number of solder ball arrays for board level interconnection.

2. Background Art

Chip scale packages (CSP) are now used in many high-density dual-inline memory modules (DIMM) for both high electrical performance and for space conservation, because the package sizes are typically no more than 20% larger than the size of the bare die. Compared to other types of semiconductor packages such as lead frame type thin small outline. packages (TSOP) or ball grid array (BGA) packages, CSP packages are substantially smaller in size such that a larger number of the memory packages can be placed on a DIMM module to achieve more memory capacity.

When a typical monolithic placement of semiconductor packages occupies all the available space on the printed wiring board (PWB) used in a DIMM module, a common way to increase the memory density is by using vertically stacked packages such as those described in U.S. Pat. No. 6,404,662 issued Jun. 11, 2002, wherein a stacked memory package is shown for a Rambus memory package. A very thin multi-chip package assembly is disclosed in U.S. Pat. No. 6,239,496 issued May 29, 2001. In U.S. Pat. No. 6,455,928, issued Sep. 24, 2002, a multiple stackable fine ball grid array (FBGA) assembly is described. In such stackable assemblies, identical FBGA packages are usually vertically stacked by placing one package on top of the other in the manner shown in FIG. 1 of the drawings.

Figure 1:
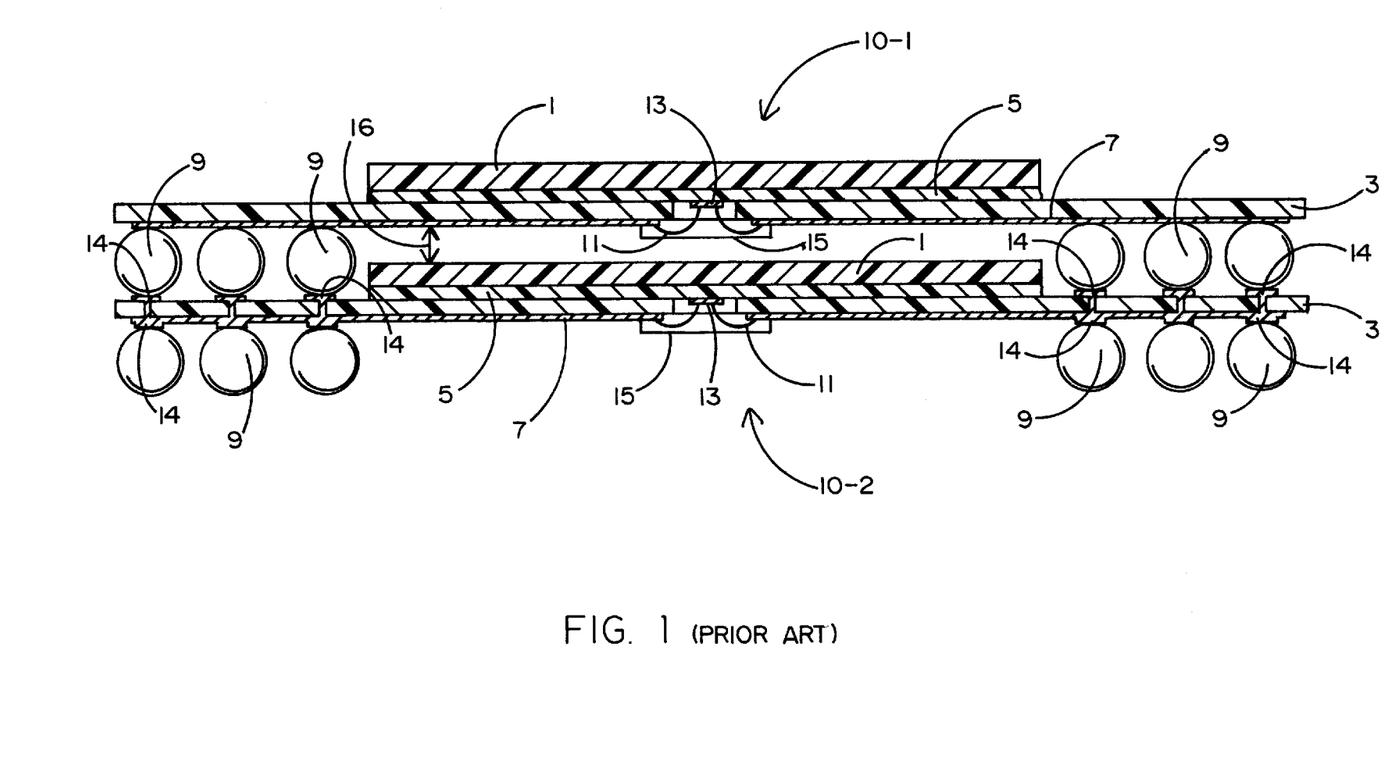
FIG. 1 shows a conventional stacked CSP package assembly having multiple arrays of perimeter solder ball interconnects.

The stacked packages 10-1 and 10-2 shown in the assembly of FIG. 1 include a number (e.g. two) of integrated circuit (IC) chips 1 that are located one above the other. The IC chip 1 from each stacked package 10-1 and 10-2 is bonded to a substrate 3 by means of a die attach adhesive 5. Each substrate 3 is laid over a substrate metalization circuit 7, and each metalization circuit 7 is supported upon an array of electrically conductive solder balls 9 that run along the outer perimeter of the package. The solder balls 9 that are associated with the upper IC chip package 10-1 are electrically connected to the solder balls 9 that are associated with the lower IC package 10-2 at respective electrical pads 14 that are connected together through the lower level substrate 3. Thus, it may be appreciated that the upper and lower level packages 10-1 and 10-2 that carry respective IC chips 1 are separated from one another by the solder balls 9. A gold bond wire 11 projects from a downwardly facing input/output pad 13 on each IC chip 1 for attachment to the substrate metalization circuit 7 via an opening that is formed in the substrate 3 of the upper and lower level packages 10-1 and 10-2. The gold bond wires 11 are surrounded by a suitable protective encapsulant 15.

Consequently, the height of the stacked package assembly of FIG. 1 is the same as the combined height of the individual IC chip packages 10-1 and 10-2. Furthermore, by using an array of solder balls 9 on each individual package 10-1 and 10-2 for the package-to-package electrical interconnection, the solder ball height, which typically is greater in thickness than the semiconductor chip 1 and its supporting substrate, will cause a gap 16 to be established between the upper and lower IC chip packages 10-1 and 10-2 in a vertical stack, unless a space-filling material is used between the adjacent stacked packages. Without using such a space-filling material, the stacked packages 10-1 and 10-2 can have a weak structural integrity since it is only the solder balls 9 along the outer perimeter of the assembly that are interconnected and the thin, fragile IC chips 1 are cantilevered or even partially suspended between the solder ball arrays.

A further deficiency in the perimeter-solder ball interconnection shown in FIG. 1 is that the overall size of the package must be increased to accommodate the relatively large solder balls 9 located along the perimeter. Hence, the stacked package assembly of FIG. 1 is larger in size than an equivalent single-chip CSP package 10-1 or 10-2 having a solder ball array located directly underneath the IC chip. This size increase reduces the effectiveness of the stacked package assembly as a compact chip scale package. Therefore, there is a need for a stacked package assembly that does not increase the planar area (in the x-y dimension) compared to the single-chip packages of the assembly having solder balls attached directly underneath the IC chip. That is to say, it is desirable to have a multi-level stacked package assembly that will only increase slightly the area occupied by an equivalent single-chip package. The stacked package assembly must also have strong structural integrity for handling, assembly and long-term reliability.

In this same regard, applications in portable electronics devices continue to require that the IC chip packages be thinner, lighter, and more robust in structure. Therefore, there is a need to provide an improved structurally robust, low profile, high density, stacked CSP package for DRAM memory and other applications. The improved package should have lower overall profile (height) and more robustness and rigidity compared to a typical stackable CSP assembly having perimeter solder ball interconnections lying between individual vertically stacked, single-chip packages as shown in FIG. 1. For maximum flexibility, the single-chip package prior to assembly should have the option of being used individually as a stand alone, single-chip package for monolithic board assembly. Or, when desired, the stand alone single-chip packages should be capable of being assembled together to form a vertically integrated multi-level chip scale package with essentially the same footprint as the single-chip package prior to stacking. Furthermore, the total height of the integrated package assembly should be less than the sum of the individual packages when stacked together using their respectively attached solder ball arrays.

SUMMARY OF THE INVENTION

In general terms, a vertically integrated multi-chip CSP package is assembled by stacking two or more single-chip CSP subassemblies one above the other. The assembly perimeter is then encapsulated with an encapsulant material such that the finished stacked package assembly has the appearance of a single CSP package having the same array of interconnection solder balls for board level assembly to a printed wiring board (PWB). The upper and the lower level CSP package subassemblies are bonded together by using conventional die attach adhesive materials. In one embodiment having a two-chip package stack, both the upper and the lower level package subassemblies are single-chip memory ball grid arrays (mBGA), i.e., a CSP package characterized by center pad bonding in a face-down configuration and adapted for use in a DRAM memory module.

More particularly, substantially identical upper and lower stand-alone CSP package subassemblies are stacked one above the other to form a space efficient integrated two package stacked assembly. Each of the upper and lower stand-alone package subassemblies includes a single integrated circuit chip that is bonded to a thin substrate. The input/output pads located below the chip are electrically connected to wire bond pads on the substrate by means of gold wires. The wire bond pads on the substrate are encapsulated by a protective encapsulant. Perimeter wire bonding pads are located on the top of the substrate and solder ball bonding pads are located on the bottom of the substrate. The perimeter wire bonding pads and the solder ball bonding pads located on opposite sides of the substrate are electrically connected together through the substrate. An array of solder balls is attached along the bottom of the substrate at the solder ball bonding pads thereof. The upper and lower level CSP package subassemblies of the two package stacked assembly differ from one another in that the substrate of the lower level subassembly and the perimeter wire bonding pads on the lower level substrate are slightly longer than the substrate of the upper level subassembly and the wire bonding pads thereon. This difference in length is necessary for a wire bond machine to perform vertical wire bonding between the upper and lower wire bonding pads of the upper and lower level CSP package subassemblies.

The upper level CSP package subassembly is mounted on and adhesively bonded to the lower level package subassembly, but without any solder balls located therebetween. Thus, an integrated stacked package is formed with the upper and lower CSP package subassemblies stacked directly one above the other. The stacked CSP package subassemblies are wire bonded by attaching gold wires between the perimeter wire bonding pads on the substrates of the upper and lower CSP package subassemblies. An encapsulant is then applied to the entire stacked assembly to seal off the wires to reinforce the adhesive bond between the upper and lower level package subassemblies. In the completed stacked assembly, only a single array of solder balls is attached along the bottom of the substrate of the lower level CSP package subassembly.

Although the preferred stacked assembly has a pair of CSP package subassemblies stacked one above the other, any suitable number (e.g. four) of CSP package subassemblies may be otherwise integrated in a vertical stack according to the teachings of this invention. Accordingly, an integrated package assembly is now possible comprising a plurality of identical integrated circuit chips that are stacked one above the other without taking up additional space on a PWB so as to be ideally suited for use in a high capacity DRAM memory module.

DETAILED DESCRIPTION

Figure 2:
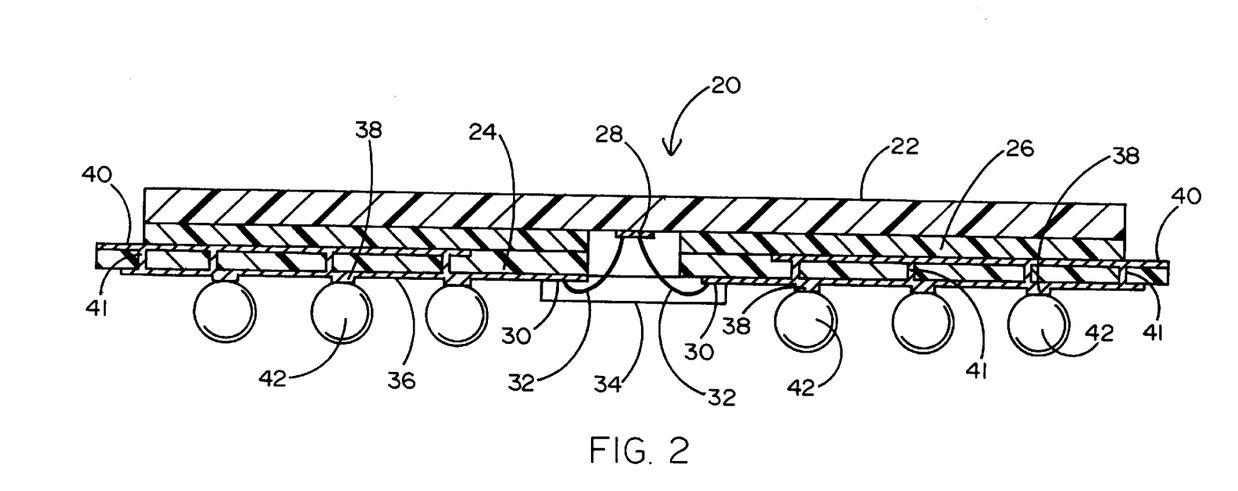
FIG. 2 shows a stand-alone, single-chip CSP package subassembly that is suitable for use as an upper level subassembly for the improved stacked package assembly of this invention.

In FIG. 2 of the drawings, the cross-section of a stand-alone, singe-chip CSP package 20 is shown. As will be explained when referring to FIG. 4, the CSP package 20 is also suitable for use as the upper level package subassembly in an improved, space efficient stackable package assembly. An integrated circuit (IC) chip 22 is assembled to a thin substrate 24 by means of a layer of adhesive die-attach material 26. The adhesive material 26 can be a compliant material to relieve stress between the substrate 24 and the IC chip 22 due to thermal expansion. By way of example, the substrate 24 can be a flexible polyimide, a thin-core laminated glass-epoxy printed wiring board (PWB), or a liquid crystal polymer (LCP) film. The downwardly facing IC input/output pads 28 that are located on the center region of the IC chip 22 is wire bonded to the substrate wire bond pads 30 by means of gold wires 32 that extend through an opening in the substrate 24 for attachment to pads 30. The wires 32 are encapsulated by an encapsulant material 34 for protection.

The substrate 24 of the single chip package 20 contains metallized conductor circuitry traces 36 for routing the electrical signals from the substrate wire bond pads 30 to solder ball bonding pads 38 and to perimeter wire bonding pads 40. Finally, an array of solder balls 42 is attached along the bottom of the substrate 24 at the solder ball bonding pads 38. In the single-chip package 20 of FIG. 2, the perimeter wire bonding pads 40 and the solder ball bonding pads 38 are located on opposite sides of the substrate 24 and interconnected with one another by way of plated through holes 41.

Figure 8:
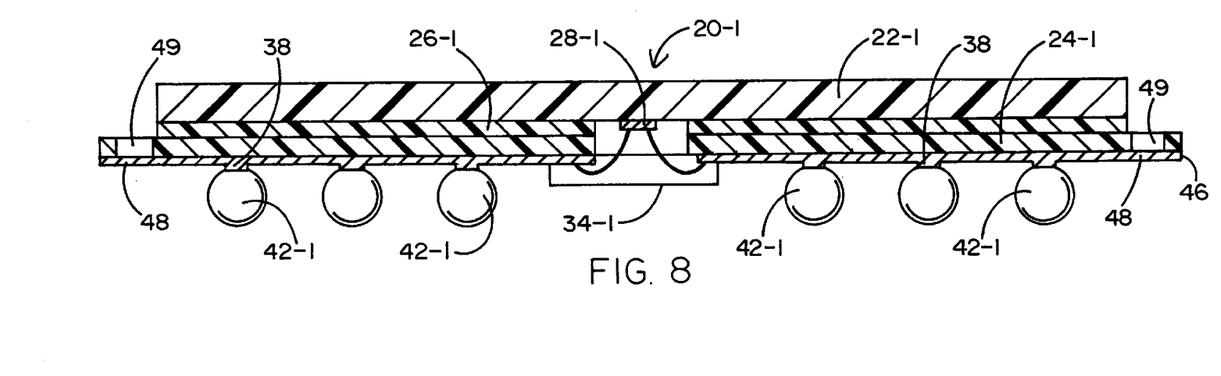
FIG. 8 shows an alternate stand-alone, single-chip CSP package subassembly for use in the stacked package assembly of this invention.

Turning briefly to FIG. 8, a single chip package 20-1 is shown having a substrate 24-1 and a single metalization circuit layer 46 running along the bottom of the substrate 24-1. In this case, the perimeter wire bond pads 48 are located on the same side as the solder ball bonding pads 38. Openings 49 above the perimeter wire bond pads 48 are formed through the substrate 24-1 through which gold wires (shown in FIGS. 9A and 9B) can be received. The openings 49 can be pre-fabricated in the substrate 24-1 by means of photoetching or laser ablation, for example.

Figure 3:
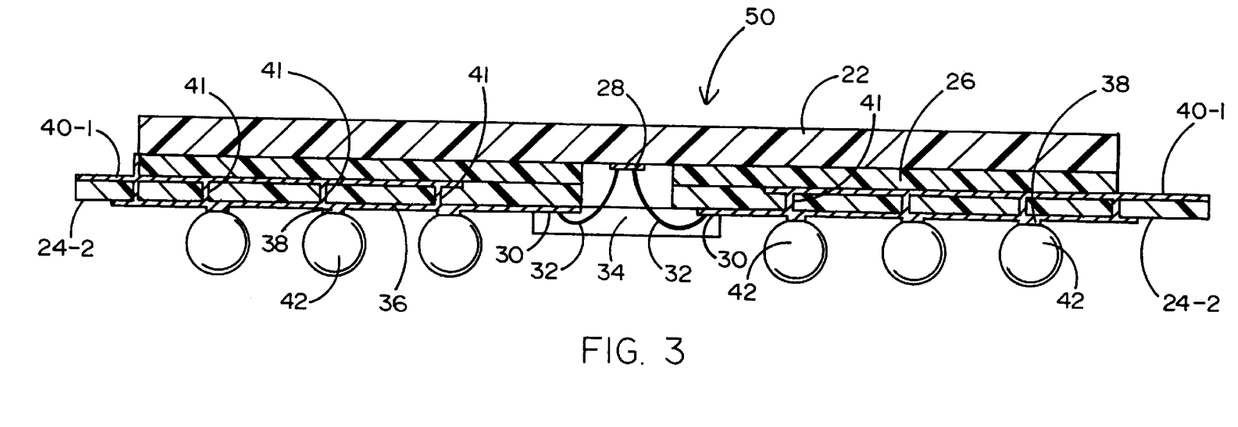
FIG. 3 shows a stand-alone, single-chip CSP package subassembly that is suitable for use as a lower level subassembly for the improved stacked package assembly of this invention.
Figure 4:
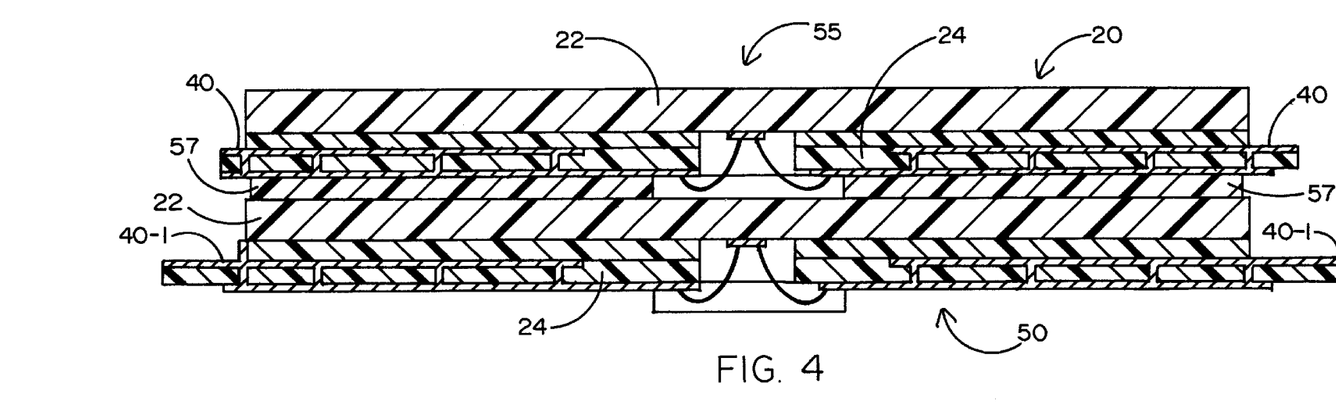
FIG. 4 shows the improved integrated stacked-package assembly of this invention prior to solder ball attachment with the upper level CSP package subassembly of FIG. 2 mounted on top of the lower level CSP package subassembly of FIG. 3.

FIG. 3 of the drawings shows the cross-section of a stand-alone, single-chip CSP package 50 that is also suitable for use as the lower level package subassembly in the improved stackable package assembly of FIG. 4. The single-chip lower level package 50 of FIG. 3 is nearly identical in construction to the single-chip upper package 20 shown in FIG. 2, except that the lateral extension of substrate 24-2 and the perimeter wire bonding pads 40-1 of the lower level CSP package 50 are slightly longer than those of the upper level CSP package 20. This additional edge extension of the substrate 24-2 and the wire bonding pads 40-1 of the lower level CSP package 50 is necessary for a wire bond machine to perform vertical wire bonding between the upper and the lower wire bonding pads 40 and 40-1 along the edges of upper and lower level packages 20 and 50 in the stacked package assembly of FIG. 5. The additional length may vary depending on the wire bond machine capillary tip size and the wire diameter chosen. It is estimated that the wire bonding pads 40-1 of the lower level CSP package 50 will be only a few tens of a millimeter (e.g. 0.1–0.2 mm) longer than the wire bonding pads 40 of the upper level CSP package 20. Alternatively, each of the single chip CSP package 20 of FIG. 2 and the single-chip CSP package 50 of FIG. 3 can be made to have a substrate with a single metalization circuit layer 46 running along the bottom thereof in the manner shown by FIG. 8.

During stand alone use, the individual CSP packages 20 and 50 of FIGS. 2 and 3 are capable of functioning independently of one another and can be assembled to a printed wiring board by a conventional monolithic surface mount assembly process through their respective arrays of solder balls 42. However, as just described, the upper level package 20 of FIG. 2 will have a slightly smaller perimeter bonding area compared to that of the lower level package 50 of FIG. 3 so that when the upper and lower package subassemblies are stacked vertically, the perimeter bonding pads of the lower package project outwardly so as to provide sufficient clearance for a wire bonding machine to perform a downward wire bonding between the upper and lower bonding pads.

In FIG. 4 of the drawings, the upper level CSP package subassembly 20 of FIG. 2 is shown mounted on top of the lower level CSP package subassembly 50 of FIG. 3, but without space consuming solder balls attached therebetween. That is to say, prior to the integration assembly shown in FIG. 4, there is no need to attach the array of solder balls 42 to the upper level package 20 of FIG. 2 as would otherwise be required if package 20 were to be used as a stand alone, single-chip package. An electronic-grade adhesive 57 is used to bond the upper level package subassembly 20 directly to the lower level package subassembly 50 to form an integrated stacked package assembly 55. The bonding adhesive 57 can be a thin sheet of adhesive material disposed across the top surface of the IC chip 22 of the lower level package subassembly 50 or across the bottom surface of the substrate 24 of the upper level package subassembly 20 in the manner illustrated in FIG. 4. In the alternative, and as is best shown by the stacked package assembly 55-1 of FIG. 5, multiple drops of adhesive 59 can be dispensed atop the IC chip 22 of the lower level package subassembly 50. Appropriate lamination and cure of the adhesive 57 or 59 are applied by using predetermined temperature and pressure to laminate the two adjacent CSP package subassemblies 20 and 50 in an efficient stacked format one above the other.

Figure 5:
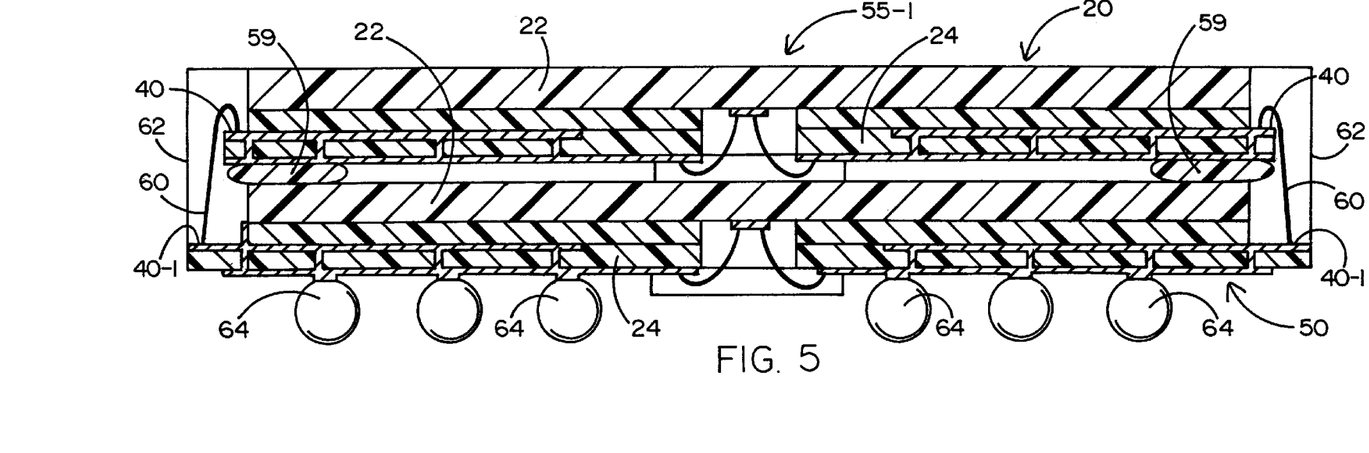
FIG. 5 shows the wire bond interconnection and encapsulation between the upper and lower level CSP package subassemblies of the integrated stacked package assembly of FIG. 4 with a single array of solder balls attached along the bottom of the lower level package subassembly.

Following lamination, the stacked package assembly 55-1 of FIG. 5 is wire bonded by using appropriate microelectronic grade gold wires 60, or the like, connected between the exposed perimeter wire bonding pads 40 of the upper level package 20 and the exposed perimeter wire bonding pads 40-1 of the lower level package 50. The stacked package 55-1 may also be vertically interconnected through the wire bonding pads 40 and 40-1 by using other interconnection means such as ribbon conductors, tape automated bonding, ribbon bonding, solder strips, or conductive polymers. After the wire-bonding is completed, an encapsulant material 62 is applied to seal off the wires 60 and secure the lamination between the upper and the lower package subassemblies 20 and 50 of the integrated package assembly 55-1.

Figure 6:
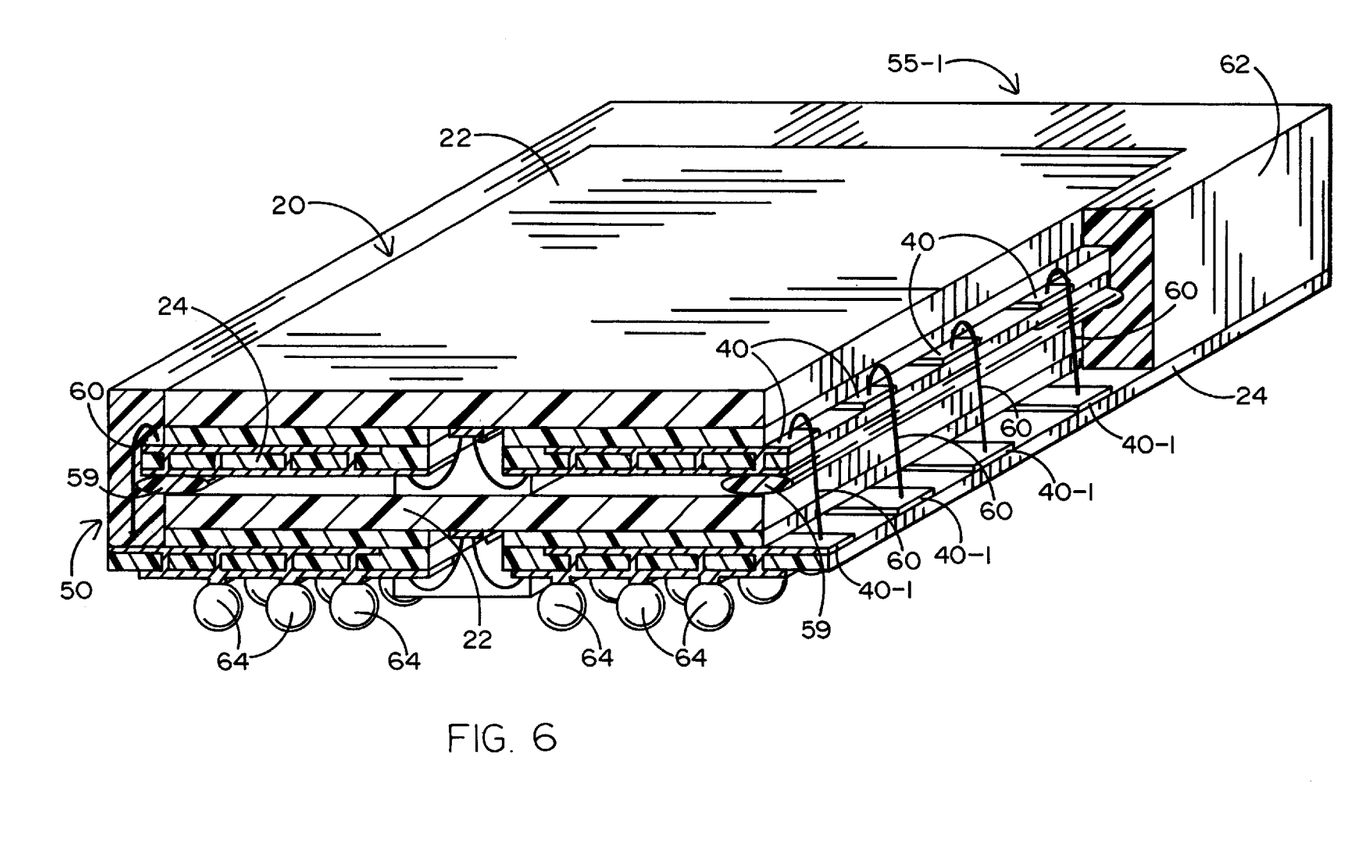
FIG. 6 is a perspective, partially broken away view of the integrated stacked package assembly of FIG. 5 having a pair of single-chip CSP package subassemblies stacked one above the other.

FIG. 6 of the drawings shows the encapsulation 62 after the stacked package assembly 55-1 has been singulated from a strip by way of a saw cut, laser cut or by punching in a manner that will be discussed in greater detail when referring to FIG. 7A. The encapsulation can be completed by using either a liquid encapsulant dispensed through the cavity opening in the strip of the upper level substrate 24 or by transfer-molding using suitable mold die-tooling. A single array of conductive solder balls 64 is attached along the bottom of the substrate 24 of the lower level package 50 of the stacked package assembly 55-1.

FIG. 6 also shows the wire bonding of the microelectronic grade gold wires 60 between the perimeter wire bonding pads 40 and 40-1 along the outer edges of the substrates 24 of the upper and lower level CSP package subassemblies 20 and 50 of stacked assembly 55-1. The encapsulation of the stacked package assembly 55-1 may be limited solely to the opposite edge perimeters where the wire bonding pads 40 and 40-1 and the wire interconnects 60 are located (as shown in FIG. 6) or may also include the exposed chip surface of the upper level subassembly 20 such that the encapsulation 62 covers the top and all four sides of assembly 55-1. By virtue of the foregoing, an increased capacity integrated assembly 55-1 is now possible having a pair of identical stacked IC chips 1 but without increasing the space that would normally be consumed on a printed wiring board by only a single one of the CSP packages.

The entire integration process for manufacturing the stack assembly 55-1 of FIG. 6 can be conducted using singulated (i.e. individual) packages. In volume production, however, this process can also be carried out in a substrate strip format that is typically used in the fabrication of single-chip CSP packages. In the strip format, a strip of the substrate material that is supported by a framing fixture is used to assemble a plurality integrated circuits in a batch process. Depending on its size, the strip may contain an array of 10 to 50 individual packages. A plurality of circuits 72 and openings 75 (shown in FIG. 7A) are formed in each substrate of the substrate strip. The width of the openings 75 inversely affects the width of the substrate. For example, for a substrate strip to be used as the upper level package subassembly, the openings 75 can be pre-cut so as to be slightly larger than the openings that are pre-cut in the strip to be used as the lower level package subassembly.

Figure 7A:
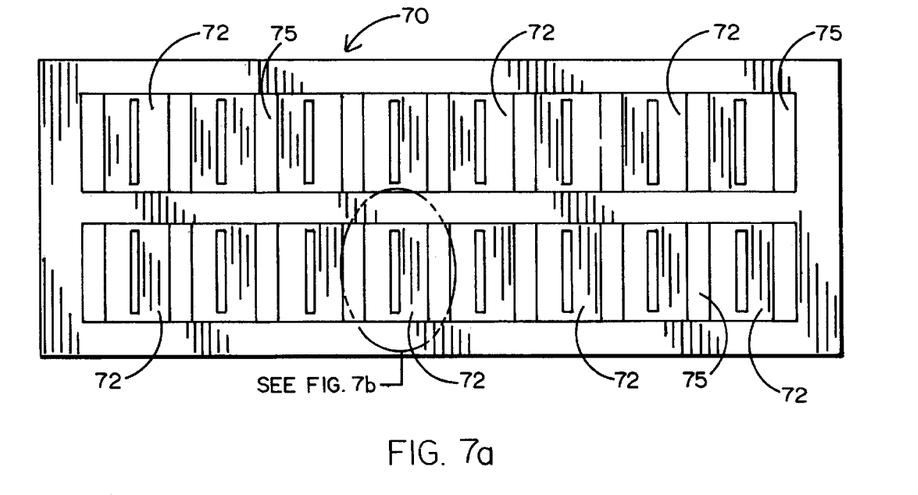
FIG. 7A and 7B show top views of a substrate strip and a single substrate pattern therefrom with the circuit layout and perimeter bonding pads for fabricating the single chip CSP package subassemblies of FIGS. 2 and 3.

FIG. 7A of the drawings illustrates a substrate strip 70 containing a plurality of identical single chip substrates 72. A diagram that is illustrative of the circuit routing layout for each individual substrate 72 is shown in FIG. 7B, where wire bond pads 30 are located near the center opening 74 and solder ball bonding pads 38 and perimeter wire bonding pads 40 are connected by individual conductive metal traces 36.

Figure 7B:
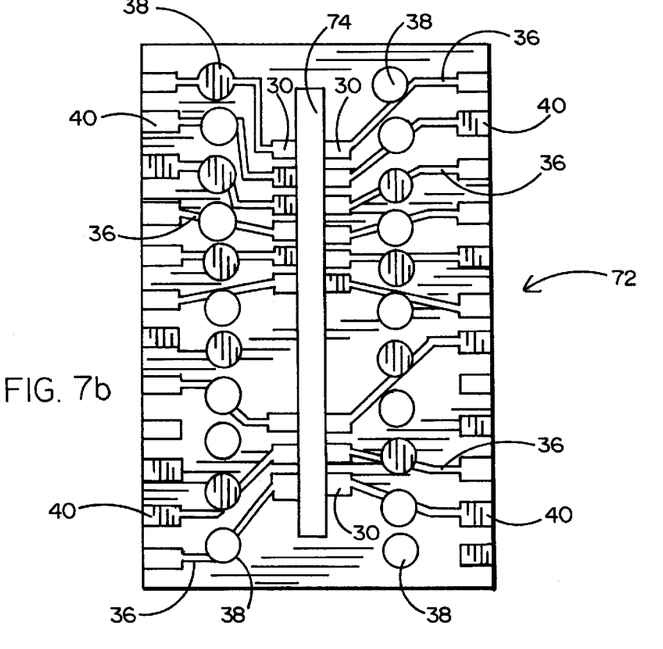

The circuitry on substrate 72 of FIG. 7b is for rerouting the signal input/outputs from the integrated circuit and for forming bonding pads to be used for both wire bond attachment and for solder ball attachment. During fabrication, the individual integrated circuit chips are attached and wire bonded to the substrate strip 70 of FIG. 7A in the manner described above while referring to FIGS. 2 and 3. When performing the stacking assembly, a strip intended to be the top subassembly is superimposed or laminated over a lower strip by using a suitable adhesive material. The laminated strips are pressed and cured using appropriate temperature and pressure.

As was earlier disclosed when referring to FIG. 8, the substrates 24-1 of the upper and lower level CSP packages (e.g. 20-1) may each contain a single metalization circuit layer 46 along the bottom that accepts the wire bonding. In this alternate case, and referring now to FIGS. 9A and 9B of the drawings, an integrated stacked CSP package assembly 80 is formed, wherein both the upper and lower level substrates 24-1 of a pair of stand alone CSP packages 20-1 include single metalization circuit layers 46 and respective perimeter wire bonding pads 48 and 48-1 having wire-bondable metal finishes such as nickel and gold. The nickel/gold finishes are typically electroplated but can also be deposited by electroless deposition. As was also disclosed when referring to FIG. 8, substrate material is removed by etching or laser ablation, for example, during prefabrication of the substrate strip to create an opening 49 through the substrates 24-1 to allow wire bond contact of the microelectronic grade gold wires 82 to the exposed perimeter bonding pads 48 and 48-1 located along the bottom of the opening 49.

Figure 9A:
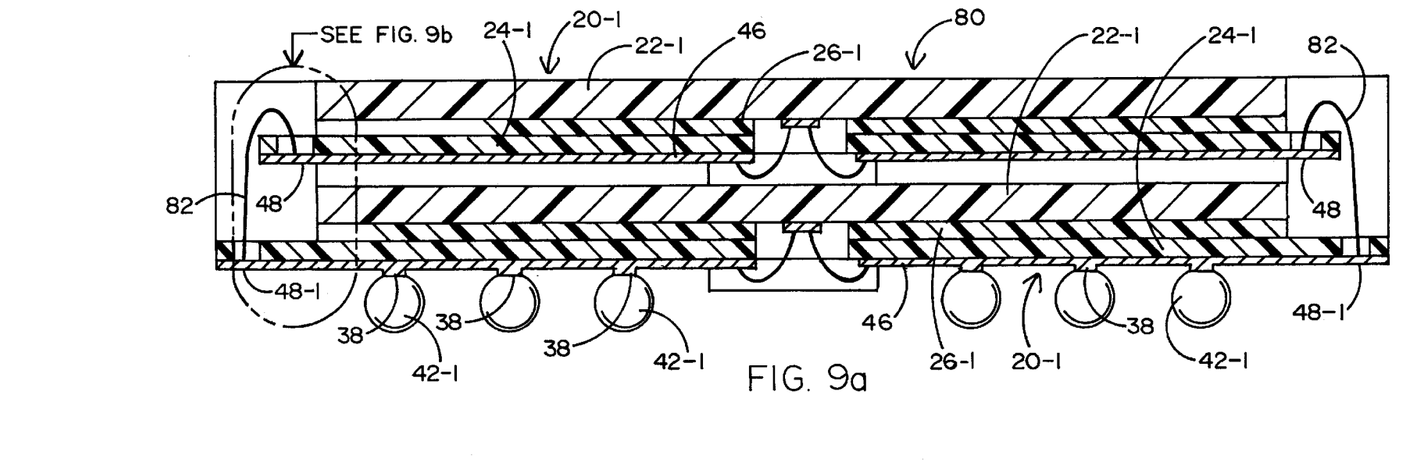
FIGS. 9A and 9B show the wire bond interconnection and encapsulation between upper and lower level CSP package subassemblies of an integrated stacked package assembly wherein each CSP package subassembly is manufactured according to the alternate assembly of FIG. 8.
Figure 9B:
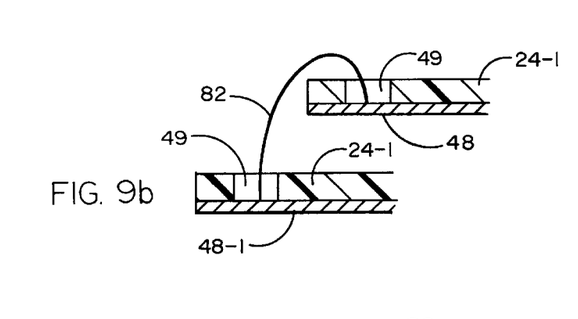
Figure 10:
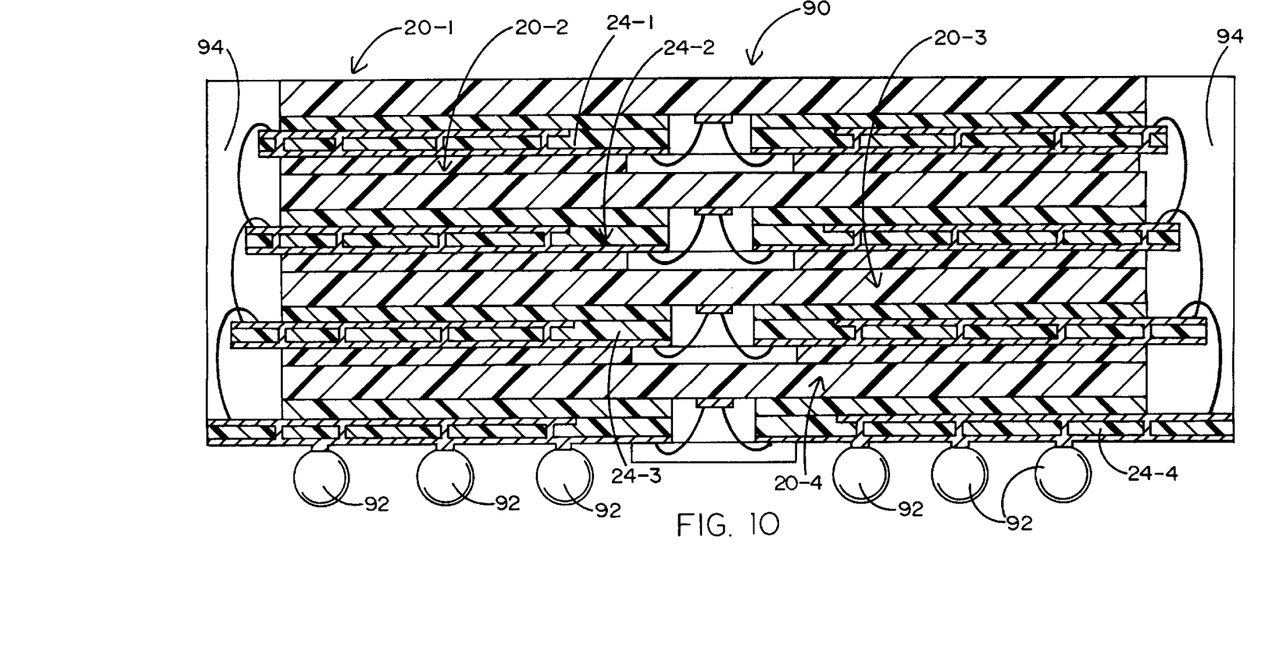
FIG. 10 shows an integrated stacked package assembly according to this invention having four CSP package subassemblies stacked one above the other.

While the integrated stacked package assemblies 55 and 80 of FIGS. 4 and 9A show a pair of CSP package subassemblies arranged in a vertical stack one above the other, it is to be understood that any suitable number of CSP packages can be stacked together to achieve the high capacity, space efficient advantages of this invention. For example, FIG. 10 of the drawings shows a multi-level chip scale package assembly 90 having a total of four stand-alone CSP packages 20-1, 20-2, 20-3 and 20-4 stacked one above the other in a cascade fashion. Only a single array of solder balls 92 need be bonded to the bottom of the lower-most CSP package 20-4 to minimize the vertical height of package 90. Moreover, and as was first described when referring to FIGS. 2 and 3, the perimeters of the substrates 24-1, 24-2, 24-3 and 24-4 of the stacked packages are made progressively longer so that wire bonding between successively longer perimeter wire bonding pads can be completed by a wire bonding machine before an encapsulant 94 is applied to complete the package 90.

The integrated stacked CSP packages 55, 80 and 90 described above are all characterized by a relatively small size. That is, each stacked package will have the appearance of a single package from the outside and a height that is shorter than had two individual packages otherwise been stacked one above the other with solder ball interconnects disposed therebetween. The stacked package assemblies of this invention are ideally suited for use in a high memory capacity DRAM memory module. In this case, both the upper and lower level packages of the assembly are preferably single chip memory ball grid arrays (mBGA) having their center pad bonding in a face down configuration as shown in FIGS. 2 and 3.

We claim:

1. An integrated chip scale package assembly comprising at least first and second chip scale packages disposed one above the other, wherein the first of said first and second chip scale packages includes an integrated circuit chip, a substrate to which said integrated circuit chip is bonded, said substrate having top and bottom sides and an extension that projects outwardly and beyond the integrated circuit chip, a plurality of solder ball bonding pads located at the bottom side of the substrate, a plurality of perimeter wire bonding pads located on the substrate extension, electrically conductive signal traces located on said substrate and interconnected between said integrated circuit chip and said plurality of perimeter wire bonding pads, and an array of solder ball interconnects attached to respective ones of said plurality of solder ball bonding pads at the bottom side of said substrate by which said first chip scale package is adapted to be attached to a printed wiring board.

2. The integrated chip scale package assembly recited in claim 1, also comprising downwardly facing signal input/output pads mounted on said integrated circuit chip and a plurality of substrate wire bond pads mounted on the bottom side of the substrate and electrically interconnected with said pluralities of solder ball bonding pads and perimeter wire bonding pads by means of said electrically conductive signal traces, said input/output pad electrically connected to said plurality of substrate wire bond pads.

3. The integrated chip scale package assembly recited in claim 1, wherein said plurality of perimeter wire bonding pads are located on the top side of the substrate so as to lie at the opposite side of the substrate on which said plurality of solder ball bonding pads are located.

4. The integrated circuit scale package assembly recited in claim 1, wherein said plurality of perimeter wire bonding pads are located on the bottom side of the substrate so as to lie on the same side of the substrate as said plurality of solder ball bonding pads.

5. The integrated circuit chip scale package recited in claim 1, wherein each of said plurality of perimeter wire bonding pads, said plurality of solder ball bonding pads, and said electrically conductive signal traces are located on a single side of the substrate, said single side being the bottom side of the substrate.

6. The integrated chip scale package assembly recited in claim 1, wherein the second of said first and second chip scale packages includes an integrated circuit chip, a substrate to which said integrated circuit chip is bonded, said substrate having top and bottom sides and an extension that projects outwardly and beyond the integrated circuit chip, a plurality of solder ball bonding pads located at the bottom side of the substrate, a plurality of perimeter wire bonding pads located on the substrate extension, and electrically conductive signal traces located on said substrate and interconnected between said integrated circuit chip and each of said pluralities of solder ball bonding pads and perimeter wire bonding pads, said second chip scale package being positioned atop said first chip scale package, without the attachment of solder ball interconnects to said plurality of solder ball bonding pads at the bottom side of the substrate of said second chip scale package, so that said first and second chip scale packages are arranged in a vertical stack without the presence of solder ball interconnects located therebetween.

7. The integrated chip scale package assembly recited in claim 6, wherein said second chip scale package is adhesively bonded directly to said first chip scale package without the presence of solder ball interconnects lying therebetween.

8. The integrated chip scale package assembly recited in claim 7, wherein said second chip scale package is adhesively bonded to said first chip scale package by means of a layer of adhesive material located between the substrate of said second chip scale package and the integrated circuit chip of said first chip scale package.

9. The integrated chip scale package assembly recited in claim 7, wherein said second chip scale package is adhesively bonded to said first chip scale package by means of drops of adhesive located between the substrate of said second chip scale package and the integrated circuit chip of said first chip scale package.

10. The integrated chip scale package assembly recited in claim 6, wherein the substrate of said second chip scale package is shorter than the substrate of said first chip scale package.

11. The integrated chip scale package assembly recited in claim 10, also comprising electrical conductors connected between the plurality of perimeter wire bonding pads located on the substrate extension of said second chip scale package and the plurality of perimeter wire bonding pads located on the substrate extension of said first chip scale package.

12. The integrated chip scale package assembly recited in claim 11, also comprising an encapsulant surrounding the vertical stack formed by said first and second chip scale packages and encapsulating said electrical conductors connected between the respective pluralities of perimeter wire bonding pads located on the substrate extensions of said first and second chip scale packages.

13. The integrated chip scale package assembly recited in claim 11, wherein said electrical conductors that are connected between the respective pluralities of perimeter wire bonding pads of said first and second chip scale packages are microelectronic grade gold wires.

14. The integrated chip scale package assembly recited in claim 11, wherein said electrical conductors are connected to the respective pluralities of perimeter wire bonding pads of said first and second chip scale packages through holes established in the substrate extensions of said first and second chip scale packages on which said plurality of perimeter wire bonding pads are located.

15. An integrated scale package assembly comprising a plurality of chip scale package subassemblies that are arranged in a vertical stack one above the other, each of said plurality of chip scale package subassemblies having an integrated circuit chip mounted on a substrate such that the substrate of an upper one of said chip scale package subassemblies in the vertical stack is mounted directly on top of the integrated circuit chip of an adjacent lower one of said chip scale package subassemblies, each substrate having a plurality of perimeter wire bonding pads and a plurality of electrically conductive signal traces connected between said plurality of perimeter wire bonding pads and the integrated circuit chip mounted on said substrate, a plurality of solder ball bonding pads located on the substrate of the bottom-most one of said vertical stack of chip scale package subassemblies, and an array of solder ball interconnects attached to respective ones of said plurality of solder ball bonding pads of said bottom-most chip scale package subassembly by which said vertical stack is adapted to be attached to a printed wiring board.

16. The integrated chip scale package assembly recited in claim 15, wherein the substrate of each of said plurality of chip scale package subassemblies has an extension that projects outwardly and beyond the integrated circuit chip that is mounted on said substrate, the plurality wire bonding pads of each substrate being located on the extension thereof, and the substrate extension of an upper one of said chip scale package subassemblies in the vertical stack being shorter than the substrate extension of the adjacent lower one of said chip scale package assemblies.

17. The integrated chip scale package assembly recited in claim 16, further comprising electrical conductors connected between the plurality of perimeter wire bonding pads located on the substrate extension of an upper one of said chip scale package subassemblies in the vertical stack and the plurality of perimeter wire bonding pads located on the substrate extension of the adjacent lower one of said chip scale package subassemblies.

18. The integrated chip scale package assembly recited in claim 17, further comprising an encapsulant surrounding the vertical stack formed by said plurality of chip scale package subassemblies and encapsulating at least the electrical conductors connected between the respective pluralities of perimeter wire bonding pads located on the substrate extensions of said plurality of chip scale package subassemblies.

* * * * *